United States Patent [19]

Ballard et al.

[11] Patent Number: 5,562,760
[45] Date of Patent: Oct. 8, 1996

[54] PLATING BATH, AND CORRESPONDING METHOD, FOR ELECTROLESSLY DEPOSITING A METAL ONTO A SUBSTRATE, AND RESULTING METALLIZED SUBSTRATE

[75] Inventors: Gerald L. Ballard; John G. Gaudiello, both of Apalachin, N.Y.

[73] Assignee: International Business Machines Corp., Armonk, N.Y.

[21] Appl. No.: 437,755

[22] Filed: May 9, 1995

Related U.S. Application Data

[62] Division of Ser. No. 202,536, Feb. 28, 1994.

[51] Int. Cl.⁶ .................... C23C 18/52; C23C 18/38
[52] U.S. Cl. .............. 106/1.24; 106/1.23; 106/1.26; 106/1.27
[58] Field of Search .................. 106/1.23, 1.24, 106/1.26, 1.27

[56] References Cited

U.S. PATENT DOCUMENTS

| | | | |
|---|---|---|---|
| 2,872,346 | 2/1959 | Miller | 117/65 |
| 3,431,120 | 3/1969 | Weisenberger | 106/1.22 |
| 3,485,643 | 12/1969 | Zeblisky et al. | 106/1.22 |
| 3,637,386 | 1/1972 | De Ruig et al. | 96/60 |
| 3,704,156 | 11/1972 | Foley, Jr. et al. | 117/47 A |
| 3,870,526 | 3/1975 | Pearlstein | 106/1.23 |
| 3,942,983 | 3/1976 | Di Blas et al. | 96/88 |
| 4,113,484 | 9/1978 | Lelental et al. | 96/68 |
| 4,143,186 | 3/1979 | Davis | 427/345 |
| 4,209,331 | 6/1980 | Kukanskis et al. | 106/1.23 |
| 4,255,194 | 3/1981 | Hough et al. | 106/1.24 |
| 4,265,943 | 5/1981 | Goldstein et al. | 427/305 |
| 4,279,948 | 7/1981 | Kukanskis et al. | 427/305 |
| 4,325,990 | 4/1982 | Ferrier | 427/305 |
| 4,617,205 | 10/1986 | Darken | 427/305 |
| 4,684,550 | 8/1987 | Milius et al. | 427/437 |
| 4,818,286 | 4/1989 | Jagannathan et al. | 106/1.23 |
| 4,877,450 | 10/1989 | Brasch | 106/1.26 |
| 5,158,604 | 10/1992 | Morgan et al. | 106/1.23 |

*Primary Examiner*—Helene Klemanski
*Attorney, Agent, or Firm*—Bernard Tiegerman

[57] ABSTRACT

An electroless metal plating bath composition, a corresponding method for electrolessly depositing a metal onto a substrate surface, as well as the resulting, metallized substrate, are disclosed. The inventive bath composition includes water, a soluble source of the metal ions it is desired to chemically reduce at, and deposit onto, the substrate surface of interest, and a complexing agent for the metal ions. In addition, the bath composition includes a soluble source of any one or more of a select group of what are termed mediator ions, which group includes palladium (Pd), platinum (Pt), silver (Ag), ruthenium (Ru), iridium (Ir), osmium (Os) and rhodium (Rh) ions, as well as a complexing agent for the mediator ions. Moreover, the bath composition includes a chemical reducing agent, which primarily serves to chemically reduce the mediator ions at the substrate surface of interest. Significantly, by using an appropriate ratio of the concentration of the metal ions in solution to the concentration of the mediator ions in solution, and depending upon which mediator ions are used, the inventive bath composition serves to electrolessly deposit the metal of interest onto the substrate surface of interest, with the resulting deposited metal containing less than or equal to about 3.0 atomic percent, or less than or equal to about 2.0 atomic percent, or even less than or equal to about 1.0 atomic percent, of the corresponding mediator metal.

12 Claims, 2 Drawing Sheets

PLATING BATH, AND CORRESPONDING METHOD, FOR ELECTROLESSLY DEPOSITING A METAL ONTO A SUBSTRATE, AND RESULTING METALLIZED SUBSTRATE

This is a divisional of copending application Ser. No. 08/202,536 filed on Feb. 28, 1994.

BACKGROUND OF THE INVENTION

1. Field of the Invention

The invention involves a plating bath, and a corresponding method, for electrolessly depositing a metal, e.g., copper, onto a substrate, such as an electronic packaging substrate, as well as the resulting, metallized substrate.

2. Description of the Related Art

The use of an electroless plating bath for electrolessly depositing a metal, e.g., copper, onto a substrate, is now a common practice in the manufacture of a variety of electronic packaging substrates, such as printed circuit boards. Such an electroless plating bath conventionally includes: (1) water; (2) a soluble compound containing the metal to be deposited onto the substrate of interest; (3) a complexing agent for the corresponding metal ions, which serves to prevent chemical reduction of the metal ions in solution while permitting selective chemical reduction on a surface of the substrate; (4) a chemical reducing agent for the metal ions; (5) a buffer for controlling pH; and (6) small amounts of additives, such as bath stabilizers and surfactants.

The electroless plating baths used to deposit, for example, copper onto printed circuit board substrates conventionally include copper sulfate as the source of copper, ethylenediaminetetraacetic acid (EDTA) as the complexing agent and formaldehyde as the reducing agent. Obviously, the use of formaldehyde as a reducing agent in such baths is undesirable because it poses health and safety problems for human beings. Moreover, such baths can only operate at pH 11 or greater. But, this is considered undesirable because certain substrates, such as polyimide substrates, cannot withstand such high pHs, over the times and temperatures needed to achieve copper plating.

One attempt at overcoming the above-described drawbacks associated with conventional copper plating baths has involved the use of amino boranes, e.g., dimethylaminoborane, as reducing agents. While these reducing agents do not pose the health and safety problems that formaldehyde poses, their relatively high cost has limited their use to small volume, high end electronic packaging substrate products.

Yet another attempt at overcoming the above-described drawbacks has involved the use of hypophosphite ions (introduced into a copper plating bath as, for example, sodium hypophosphite) as the reducing agent. While hypophosphite is relatively innocuous, it has been found that when used as a reducing agent (in the absence of nickel or cobalt ions, discussed below), the corresponding deposition of copper stops after a very short period of time, with the thickness of the deposited copper being no more than about 1 micrometer. That is, while such a bath is initially autocatalytic in relation to the reduction of copper ions at a substrate surface, it quickly becomes non-autocatalytic. It is believed that this behavior is due to the incorporation of phosphorus (from the hypophosphite) into the substrate surface, which poisons the chemical reduction reaction at the substrate surface.

Significantly, as described in U.S. Pat. No. 4,265,943, issued to Goldstein et al on May 5, 1981, which is hereby incorporated by reference, it has been found that the introduction of nickel ions or cobalt ions into an electroless copper plating bath using a hypophosphite reducing agent serves to overcome the above-described problem. That is, the presence of nickel ions or cobalt ions serves to convert the above-described non-autocatalytic copper-reduction reaction into one which is autocatalytic, resulting in continuous deposition of copper. However, if, for example, nickel ions are used, then it has been found by the present inventors that the resulting deposited copper invariably contains at least 3.63 atomic percent incorporated nickel, while if cobalt ions are used, then it has also been found by the present inventors that the resulting deposited copper invariably contains even more incorporated cobalt. In either event, such relatively large amounts of incorporated nickel or cobalt are unacceptable for many applications.

Thus, those engaged in the development of electroless metal plating baths have sought, thus far without success, techniques for converting an otherwise non-autocatalytic metal-reduction reaction using hypophosphite into an autocatalytic reaction, but which result in less than, and preferably significantly less than, 3.63 atomic percent unwanted metal being incorporated into the desired, deposited metal.

SUMMARY OF THE INVENTION

The invention involves the finding that the use of palladium (Pd), platinum (Pt), silver (Ag), ruthenium (Ru), iridium (Ir), osmium (Os) or rhodium (Rh) ions (hereinafter denominated mediator ions), in lieu of nickel or cobalt ions, in an electroless metal plating bath employing a hypophosphite reducing agent also serves to convert an otherwise non-autocatalytic metal-reduction reaction into an autocatalytic reaction. In fact, the reducing agent need not be a hypophosphite reducing agent and, as explained below, any reducing agent which is effective in reducing the mediator ions (not the metal ions which are ultimately also to be reduced and deposited) is useful. Moreover, unexpectedly, it has been found that by using appropriate amounts of these mediator ions in the electroless plating bath one readily obtains desired, deposited metal containing significantly less than 3.63 atomic percent of incorporated mediator metal. That is, by using appropriate ratios of the concentration of the metal ions it is desired to reduce and deposit to the concentration of mediator ions, depending upon which mediator ions one uses, one readily obtains deposited, desired metal containing less than or equal to about 3.0 atomic percent, or less than or equal to about 2.0 atomic percent, or less than or equal to about 1.0 atomic percent, of incorporated mediator metal, substantially uniformly distributed throughout the desired metal. If, for example, the metal to be deposited is copper and the mediator ions are palladium ions, and the corresponding concentration ratio is 2400:1, then one readily achieves deposited copper containing just 0.22 atomic percent palladium, substantially uniformly distributed throughout the copper.

BRIEF DESCRIPTION OF THE DRAWINGS

The invention is described with reference to the accompanying drawings, wherein.

DETAILED DESCRIPTION OF THE PREFERRED EMBODIMENT(S)

Figure 1:
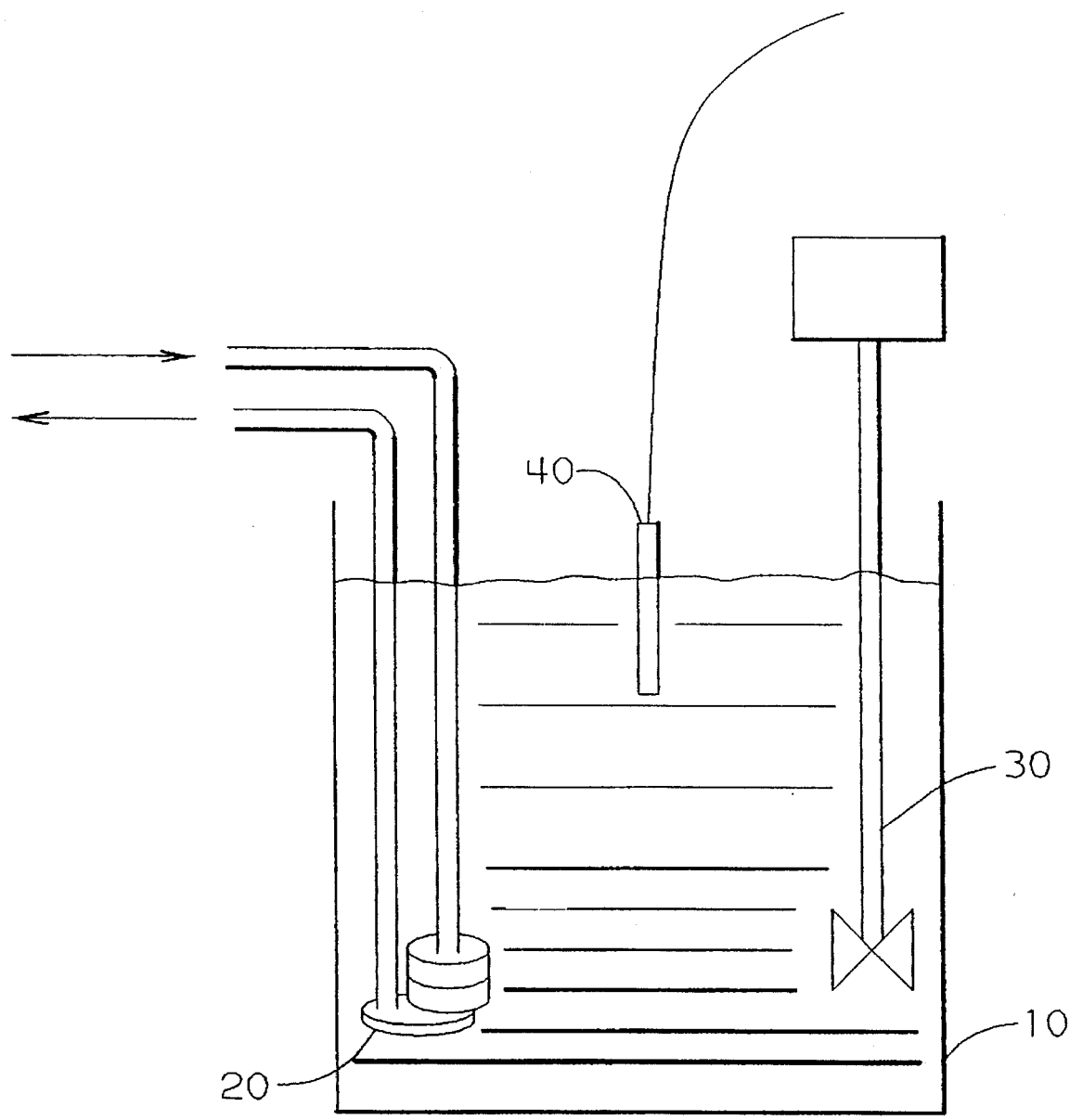
FIG. 1 is a view of an electroless metal plating bath container, in accordance with the present invention.

The invention involves an electroless metal plating bath for electrolessly depositing a metal, e.g., copper, onto a substrate, such as a printed circuit board substrate. The invention also involves a corresponding method for electrolessly depositing a metal onto a substrate. The invention further involves the resulting metallized substrate.

The inventive electroless metal plating bath of the present invention has a composition which includes water and a soluble source of the metal ions, e.g., copper ions, which it is desired to chemically reduce at, and deposit onto, a substrate surface of interest. The soluble source of metal ions is, for example, a salt of the metal of interest, such as copper sulfate. In addition, the composition of the inventive bath also includes a complexing agent for the metal ions, which serves to prevent the homogeneous chemical reduction of the metal ions, i.e., chemical reduction of the metal ions in solution, while permitting the heterogeneous reduction of the metal ions, i.e., reduction of the metal ions at the substrate surface of interest.

Significantly, the composition of the inventive bath also includes a soluble source of one or more of a select group of what are here termed mediator ions (which are to be distinguished from the metal ions intended to be reduced at, and deposited onto, the substrate surface of interest.) This select group includes palladium (Pd), platinum (Pt), silver (Ag), ruthenium (Ru), iridium (Ir), osmium (Os) and rhodium (Rh) ions, with a preferred subset of the select group including palladium (Pd), platinum (Pt) and silver (Ag) ions, and the most preferred of the mediator ions being palladium (Pd) ions. In addition, the bath composition includes a complexing agent for the mediator ions, which, in general, is different from the complexing agent used with the metal ions intended to be reduced at, and deposited onto, the substrate surface of interest. This complexing agent for the mediator ions performs the same function as the complexing agent for the metal ions.

Equally significantly, the composition of the inventive bath further includes a chemical reducing agent which is chosen to primarily reduce the mediator ions at the substrate surface of interest, not the metal ions ultimately intended to be reduced at, and deposited onto, the substrate surface of interest. (This chemical reducing agent may, to a lesser degree, necessarily and/or unavoidably also serve to reduce some of the metal ions at the substrate surface of interest.) One such reducing agent is, for example, hypophosphite ions, which are readily introduced into the bath in the form of sodium hypophosphite. It must be emphasized that when used within the context of the inventive bath, the reducing agent serves primarily to chemically reduce the mediator ions at the substrate surface of interest, and only secondarily, if at all, the metal ions.

Preferably, the inventive bath also includes a buffer system, such as boric acid, for controlling pH. In addition, as discussed more fully below, the inventive bath is alkaline in nature, although not as alkaline as previous electroless plating baths. Such alkalinity is achieved by adding appropriate amounts of, for example, sodium hydroxide to the bath. Consequently, the inventive bath contains an excess of hydroxyl ions over hydroniums ions.

The inventive bath preferably also includes a surfactant, such as dodecyl sodium sulfate.

It must be noted that the inventive bath is only useful in electrolessly depositing a metal onto a substrate provided the substrate includes a patterned or unpatterned layer of metal or metallic seed on its upper surface. That is, metal deposition only occurs on those areas of the substrate surface which already bear metal or seed. Such a patterned or unpatterned layer may, for example, be a patterned or unpatterned layer of nickel or cobalt, formed using any of a variety of conventional techniques. Alternatively, the patterned or unpatterned layer may be a relatively thin metallic seed layer, such as a noble metal seed layer, e.g., a palladium seed layer, or a palladium-tin colloid seed layer, formed using conventional seeding techniques. (See, e.g., Principles Of Electronic Packaging, edited by D. P. Seraphim et al (McGraw-Hill, 1989), pp. 532–537, regarding conventional seeding techniques.) Thus, for example, an electrically insulating substrate, such as a printed circuit board substrate, bearing a patterned or unpatterned layer of metal on its upper surface is readily metallized via the inventive electroless plating bath.

While the utility of the inventive bath is not dependent on any theoretical understanding of the underlying chemistry of the bath, it should be noted that a corresponding theory has been developed. Underlying this theory is the assumption that the substrate to be metallized via the inventive electroless plating bath includes a patterned or unpatterned metallic layer on its upper surface, which, as discussed above, is required for metallization to occur. This theory is also based upon the fact (not theory) that the reducing agent introduced into the inventive bath, e.g., hypophosphite ions, serves primarily to reduce the mediator ions at the surface of the substrate metallic layer.

In accordance with the theory developed in connection with the inventive electroless plating bath, it is hypothesized that the mediator metal, e.g., palladium, reduced at, and deposited onto, the surface of the substrate metallic layer serves to catalyze the oxidation of the reducing agent at the surface of the substrate metallic layer. This oxidation results in a corresponding release of electrons which, it is believed, are conducted by the mediator metal into, and throughout, the existing substrate metallic layer. It is these electrons which then serve to reduce the metal ions in solution at the surface of the mediator metal and existing metallic layer. Once the existing metallic layer is covered by deposited metal, additional mediator metal is reduced at, and deposited onto, the surface of the deposited metal, which deposited metal then takes over the role of the original metallic layer.

The above-described theory is exemplified by chemical reactions (1)–(3), below, where the mediator ions are assumed to be palladium ions, the reducing agent is assumed to be hypophosphite ions and the metal ions which it is desired to reduce and deposit are assumed to be copper ions. In these reactions, for the sake of simplicity, the presence of the complexing agents is ignored.

$$2H_2PO_2^- + Pd^{2+} + 2OH^- \longrightarrow Pd^0 + 2H_2PO_3^- + H_2 \quad (1)$$

$$2H_2PO_2^- + 2OH^- \xrightarrow{Pd} 2H_2PO_3^- + H_2 + 2e^- \quad (2)$$

$$Cu^{2+} + 2e^- \longrightarrow Cu^0 \quad (3)$$

As should be evident, reaction (1) describes the chemical reduction of palladium ions by the hypophosphite ions at the surface of the substrate metallic layer. Reaction (2) describes the oxidation of the hypophosphite ions, as catalyzed by the reduced palladium, and the corresponding release of electrons, which are conducted by the palladium into and throughout the existing substrate metallic layer. Reaction (3) then describes the reduction of copper ions by the released electrons at the surface of the reduced palladium and existing substrate metallic layer. It must be emphasized that the utility of the inventive bath is not at all dependent on the accuracy or completeness of the above-described theory.

As noted above, it has been found that the use of any one or more of the mediator ions in the inventive plating bath results in the incorporation of relatively little of the mediator metal into the desired, deposited metal. That is, by using appropriate ratios of the concentration of the metal ions it is desired to reduce and deposit to the concentration of any of the above-listed mediator ions, one readily obtains desired, deposited metal containing less than or equal to about 3.0 atomic percent of mediator metal, distributed substantially uniformly throughout the desired metal. (For purposes of the present invention, substantially uniformly means that the concentration of the mediator metal at any point in the desired metal varies by no more than twenty (20) percent from the nominal concentration.) Similarly, by using appropriate ratios of the concentration of the metal ions it is desired to reduce and deposit to the concentration of either palladium (Pd), platinum (Pt) or silver (Ag) mediator ions, one readily obtains desired, deposited metal containing less than or equal to about 2.0 atomic percent of mediator metal, distributed substantially uniformly throughout the desired metal. Further, by using appropriate ratios of the concentration of the metal ions it is desired to reduce and deposit to the concentration of palladium (Pd) mediator ions, one readily obtains desired, deposited metal containing less than or equal to about 1.0 atomic percent of palladium, distributed substantially uniformly throughout the desired metal. Typically, the greater the ratio of the metal ions it is desired to reduce and deposit to the concentration of the corresponding mediator ions, the less mediator metal is incorporated into the deposited, desired metal. In general, the ratio needed to achieve a particular concentration of incorporated mediator metal in the desired, deposited metal is determined empirically by using control samples of the substrate of interest and varying the concentration ratio in the inventive bath. For example, if the metal ions to be reduced and deposited are copper ions and the mediator ions are palladium ions, and if, as discussed below, one uses a ratio of the concentration of the former to the latter which is equal to 2400:1, one readily achieves deposited copper containing just 0.22 atomic percent palladium distributed substantially uniformly throughout the copper. In this regard, in connection with the above-described theory, it is believed that the mediator ions of the present invention are much more efficient in catalyzing the oxidation of the reducing agent than are, for example, nickel ions or cobalt ions. Therefore, these mediator ions are necessarily much more efficient in achieving the corresponding release of electrons than are nickel or cobalt ions. Consequently, much less of the mediator ions of the present invention need be used in the inventive plating bath, and therefore much less mediator metal is incorporated into the desired, deposited metal.

As noted above, in connection with the composition of the inventive plating bath, a complexing agent is used in relation with the metal ions it is desired to reduce and deposit and the same or a different complexing agent is used in relation with the mediator ions. If the same complexing agent is used in relation with the metal ions and the mediator ions, then it is important that the formation constant for the metal ions and the complexing agent, as well as the formation constant for the mediator ions and the complexing agent, be equal to or greater than about $10^8$. (Formation constants are readily available in standard references such as the Handbook of Chemistry and Physics, edited by R. C. Weast and published by CRC Press.) On the other hand, if different complexing agents are used in relation with the metal ions and the mediator ions, then in choosing a complexing agent for the metal ions, it is important that the formation constant for the metal and corresponding complexing agent be equal to or greater than about $10^8$. Moreover, this formation constant should be at least a factor of $10^3$ greater than the formation constant for this same complexing agent and the mediator metal. Similarly, in choosing a complexing agent for the mediator ions, it is important that the formation constant for the mediator metal and corresponding complexing agent be equal to or greater than about $10^8$. Further, this formation constant should be at least a factor of $10^3$ greater than the formation constant for this complexing agent and the metal. It has been found that adherence to these criteria will ensure that the complexing agent used with the metal ions stays bound to the metal ions, and that the complexing agent used with the mediator ions stays bound to the mediator ions.

If, for example, the mediator ions to be used are palladium ions and the metal ions to be reduced and deposited are copper ions, then by using the above criteria it can readily be shown that useful complexing agents for palladium include ethylenediamine (EN), tetramethylethylenediamine (TMEN), ethylenediaminetetraacetic acid (EDTA) and N,N,N',N'-tetrakis (2-hydroxypropyl)-ethylenediamine, which is sold under the trade name Quadrol by the Sigma-Aldrich Corporation of Milwaukee, Wis. On the other hand, if the mediator ions are platinum ions and the metal ions to be reduced and deposited are copper ions, then it can readily be shown that a useful complexing agent for the platinum is EDTA. Furthermore, if the mediator ions are silver ions and the metal ions to be reduced and deposited are copper ions, then it can readily be shown that a useful complexing agent for the silver is sodium cyanide (NaCN). Depending upon the complexing agent used with these mediator ions, it can also be shown that useful complexing agents for the copper include sodium potassium tartrate, sodium citrate, EDTA and Quadrol.

Also in connection with the composition of the inventive plating bath, as noted above, hypophosphite ions constitute one useful reducing agent for the mediator ions. However, it has been found that there are a variety of other useful reducing agents, including sodium borohydride and dimethylaminoborane.

As mentioned above, the inventive bath is alkaline in nature. Significantly, the pH of the bath preferably ranges from about 8.0 to about 9.7, which is lower than previous such baths. As also mentioned above, the bath preferably includes a buffer, such as boric acid. While pHs less than about 8.0 and greater than about 9.7 can be used, operation at these pHs is undesirable because the corresponding buffer capacities are very small or almost non-existent.

Significantly, the type of container used to form the inventive bath, as well as the order in which the constituents of the inventive bath are incorporated into the bath, are critical to achieving and maintaining bath stability, i.e., preventing the occurrence of the homogeneous reaction. That is, as depicted in FIG. 1, the inventive bath should be formed in a non-metallic, e.g., a plastic or glass, container 10, to prevent reduction of the metal ions on the walls of the container. In addition, this container 10 should include a heating system 20, e.g., a non-metallic immersion heat exchanger (as depicted in FIG. 1) or a non-metallic immersion electrical heater, as well as a corresponding circulation system 30, to achieve substantially uniform heating of the bath, i.e., local temperatures should not fluctuate by more than 1 degree Centigrade (C.). Local temperature fluctuations greater than 1 degree C. are undesirable because they lead to undesirable, local homogeneous reactions, i.e., local reductions of metal ions in solution.

When forming the bath, to achieve and maintain stability, water and the corresponding buffer should first be placed into the bath container. Then, the pH of the bath should be adjusted to the operating pH by adding a base, such as sodium hydroxide, if the pH is too low, or by adding an acid, such as sulfuric acid, if the pH is too high. The soluble metal-containing compound, e.g., a metal salt, and the corresponding complexing agent, should then be added to the bath. Thereafter, the surfactant should be added, if used.

Following the above steps, the next step in the formation of the inventive electroless plating bath is to add the reducing agent for the mediator ions to the bath. This may cause the pH of the bath to vary from the operating pH, and therefore the bath pH should be re-adjusted to the original operating pH. Thereafter, the soluble mediator-containing compound, and the corresponding complexing agent, should be added to the bath. If this complexing agent is different from that used with the metal ions it is desired to reduce and deposit, then the mediator ions are complexed before addition. This is accomplished by dissolving the soluble mediator-containing compound in water containing the complexing agent and adjusting the pH to achieve optimum complexation. A small volume of this stock solution is added to the inventive bath to achieve the desired ratio of concentration of metal ions to concentration of mediator ions. As discussed below, this stock solution is also used to maintain the concentration of the mediator ions at a desired concentration so as to maintain the desired concentration ratio.

It must be emphasized that the above-described order for incorporating the constituents of the inventive bath into the bath is absolutely essential to providing the ordinarily skilled artisan with a disclosure which will enable the artisan to practice the present invention. Any disclosure which lacks this order of incorporation would not be enabling, and would likely lead the ordinarily skilled artisan to an unstable bath, i.e., a bath which exhibits the homogeneous reaction.

After constructing the inventive bath, as described above, the bath is operated by initially raising the temperature of the bath to the operating temperature, which will typically fall within an operating temperature range. In general, this temperature range is determined empirically. That is, below the low end of the temperature range, no metal deposition will occur. Above the upper end of the temperature range, the bath will become unstable, i.e., the homogeneous reaction will occur.

Figure 2:
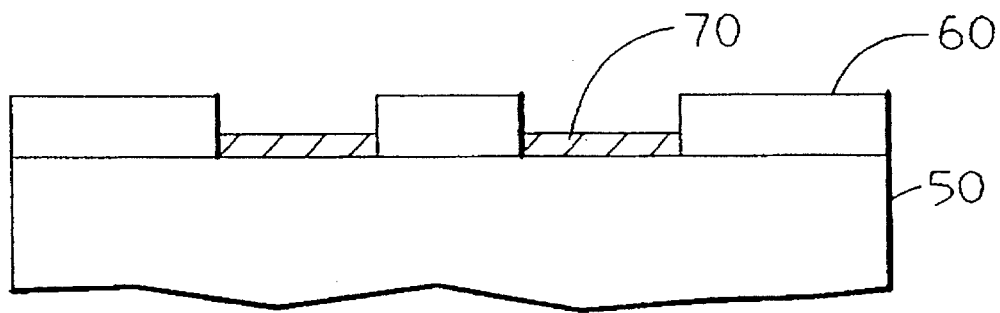
FIGS. 2(a)-(b) depict the steps involved in electrolessly depositing a metal onto a substrate, in accordance with the present invention.
Figure 2:
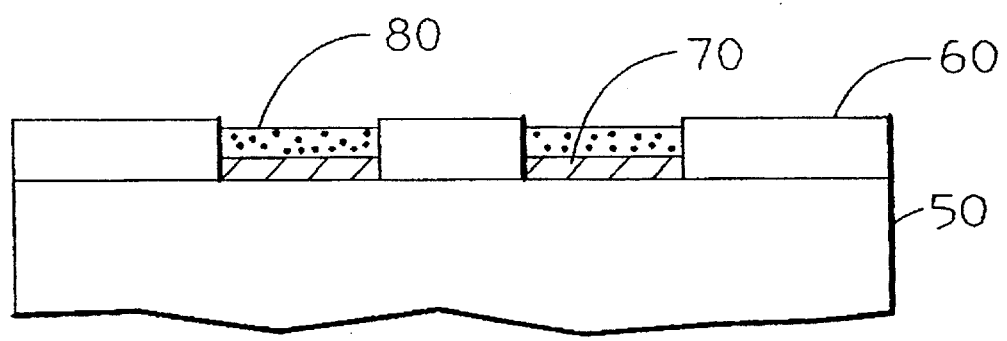

After the bath has been raised to its operating temperature, the substrate of interest should be immersed in the bath. As depicted in FIG. 2(a), such a substrate is, for example, an electrically insulating substrate 50, such as a printed circuit board substrate, bearing, for example, a patterned metallic layer 70 on its upper surface. Such a patterned metallic layer layer 70 is formed, for example, by initially forming a patterned photoresist layer 60 on the upper surface of the substrate 50 using conventional photolithographic techniques, and then forming a correspondingly patterned, metallic seed layer using conventional seeding techniques. While the substrate is immersed in the bath, the circulation system 30 (see FIG. 1) associated with the bath container 10 should maintain the bath at a substantially uniform operating temperature (i.e., local temperature fluctuations should be no greater than 1 degree C.) to ensure uniformity of metal deposition.

Preferably, to achieve reproducible results during metal deposition, the concentration of the metal ions in solution, the concentration of the reducing agent and the pH of the bath should be monitored, using conventional techniques, and maintained to within 10 percent of the corresponding set values established for the bath. For the same reason, the concentration of the mediator ions should also be monitored and maintained to within 10 percent of the corresponding set value. Significantly, the latter is readily achieved by monitoring the so-called mix potential of a surface undergoing plating in the bath, relative to the potential of a reference electrode 40 (see FIG. 1), such as a conventional, saturated Calamel electrode, placed in the bath. That is, the electrochemical potential exhibited by, for example, an electrode placed in the bath which itself undergoes plating, relative to the potential of the reference electrode 40 placed in the bath, is proportional to the concentration of mediator ions in the bath. Alternatively, the electrochemical potential exhibited by the substrate surface undergoing plating (as measured via, for example, an electrical wire placed in contact with the substrate surface), relative to the potential of the reference electrode 40 placed in the bath, is also proportional to the concentration of mediator ions in the bath. Obviously, one can, prior to initiating operation of the bath, measure mix potential as a function of mediator concentration, draw a corresponding plot and then refer to this plot during bath operation when monitoring mix potential, and thereby monitoring mediator concentration. If the mix potential, and therefore mediator concentration, becomes too low, small amounts of the mediator stock solution, described above, can be added to the bath to maintain a constant mediator concentration.

It should be noted that metal deposited onto a substrate via the inventive electroless plating bath is readily distinguished from the same metal, deposited using prior electroless plating baths. That is, the presence and concentration of the mediator metals of the present invention (as a function of depth) are readily detected in the deposited metal using conventional techniques. For example, such detection is readily achieved by impinging a high energy beam of ions, e.g., argon ions, upon the deposited metal and then using conventional x-ray photoelectron spectroscopy techniques to detect the presence and relative amounts of the materials "kicked out" by the ion beam.

As a pedagogic aid to a more complete understanding of the invention, a description of the formation of an electroless copper plating bath, as encompassed by the present invention, is given below.

Using the container 10 depicted in FIG. 1, water and boric acid (the buffer) are placed in the container. The concentration of the boric acid in the water bath should range from about 0.1M to about 0.4M, and is preferably about 0.2M. The pH of the water/boric acid bath should be adjusted (by adding, for example, sodium hydroxide) to range from about 8.0 to about 9.7. The use of pHs outside this range is undesirable because the corresponding buffer capacity is undesirably small.

Copper sulfate and a corresponding complexing agent, such as sodium citrate, are now added to the bath. The concentration of the resulting copper complex should range from about 1 mM to about 30 mM, and is preferably about 20 mM. Concentrations less than about 1 mM are undesirable because the corresponding plating rate is undesirably low and more than about 3.0 atomic percent mediator metal will be incorporated into the deposited copper. Concentrations greater than about 30 mM are undesirable because copper plating will stop.

Sodium hypophosphite (the mediator reducing agent) is now added to the bath. The concentration of this reducing agent should range from about 0.1M to about 0.35M, and is preferably about 0.27M. Concentrations less than about 0.1M are undesirable because they result in little or no copper plating. Concentrations greater than about 0.35M are undesirable because they result in significantly reduced bath stability.

A source of palladium ions (the mediator ions) is now complexed with a corresponding complexing agent in a separate beaker, and a portion of the resulting stock solution is added to the bath. The concentration of the palladium complex in the bath should range from about 0.0125 mM to about 2.0 mM, and is preferably about 0.015 mM. Concentrations less than about 0.0125 mM are undesirable because the corresponding copper plating rate is undesirably low. Concentrations greater than about 2.0 mM are undesirable because the amount of palladium incorporated into the deposited copper is greater than about 3.0 atomic percent.

The operating temperature of the above-described copper plating bath ranges from about 60 degrees C. to about 75 degrees C. Temperatures less than about 60 degrees C. are undesirable because they result in little or no copper plating. Temperatures greater than about 75 degrees C. are undesirable because they result in significantly reduced bath stability.

EXAMPLE 1

An electroless copper plating bath, employing palladium mediator ions, was constructed as described below. In this bath, the ratio of the concentration of the copper ions (complexed with a complexing agent) to the concentration of the palladium ions (complexed with a complexing agent) was 140:1. The copper deposited onto a substrate immersed in the bath contained about 3.0 atomic percent palladium, distributed substantially uniformly throughout the copper.

Using a 1.5 liter container, like the one pictured in FIG. 1, an electroless copper plating bath was constructed by initially pouring 950 mL of water into the container. Then, 9.263 grams of boric acid was added to the water bath, to yield a corresponding 0.15M solution. The pH of this water/boric acid solution was adjusted to 9.2 by the addition of 50 percent sodium hydroxide solution.

Precisely 1.030 grams of sodium citrate dihydrate was then added to the above bath, to yield a corresponding 0.035M solution. Then, 0.437 grams of copper sulfate pentahydrate was added, to yield a corresponding 0.00175M solution. Thereafter, 10.600 grams of sodium hypophosphite was added to the bath, to yield a corresponding 0.100M solution.

The pH of the above-described bath was re-adjusted to 9.2 by adding additional 50 percent sodium hydroxide solution.

In a separate glass container containing 1 liter of water, 3.836 grams of bis(benzonitrile)palladium(II)dichloride and 1.743 grams of tetramethylethylenediamine were dissolved. This resulted in, respectively, a corresponding 0.010M solution and a 0.015M solution. Of this stock solution, 1.25 mL was added to the electroless plating bath, resulting in a corresponding 12.5 millimolar palladium solution.

Water was added to the electroless copper plating bath to bring the total volume of the bath to 1 liter.

The substrate to be metallized was immersed in the electroless copper plating bath after the bath was heated to 65 degrees C.

During copper plating, the mix potential of the subtrate was monitored in order to monitor the concentration of palladium ions in the bath. In order to maintain the mix potential to within 10 mV of the initial value, 0.1 milliliters of the stock solution was added to the bath.

The copper and hypophosphite ion concentrations were monitored and maintained to within 10 percent of the corresponding initial values.

The pH of the bath was also monitored and maintained to within 0.1 units by addition of 50 percent sodium hydroxide solution.

EXAMPLE 2

A second electroless copper plating bath, also employing palladium mediator ions, was constructed. In this bath, the ratio of the concentration of the copper ions (complexed with a complexing agent) to the concentration of the palladium ions (complexed with a complexing agent) was 160:1. The copper deposited onto a substrate immersed in the bath contained 2.26 atomic percent incorporated palladium, distributed substantially uniformly throughout the copper.

The second electroless copper plating bath was constructed and operated in exactly the same fashion as the one described in Example 1, with two exceptions. That is, the amount of sodium citrate dihydrate added to the bath was 1.486 grams, resulting in a corresponding 0.004M solution. In addition, the amount of copper sulfate pentahydrate added to the bath was 0.499 grams, resulting in a corresponding 0.002M solution.

EXAMPLE 3

A third electroless copper plating bath, also employing palladium mediator ions, was constructed. In this bath, the ratio of the concentration of the copper ions (complexed with a complexing agent) to the concentration of the palladium ions (complexed with a complexing agent) was 400:1. The copper deposited onto a substrate immersed in the bath contained 0.98 atomic percent incorporated palladium, distributed substantially uniformly throughout the copper.

The third electroless copper plating bath was constructed and operated in exactly the same fashion as the one described in Example 1, with two exceptions. That is, the amount of sodium citrate dihydrate added to the bath was 2.943 grams, resulting in a corresponding 0.010M solution. In addition, the amount of copper sulfate pentahydrate added to the bath was 1.294 grams, resulting in a corresponding 0.005M solution.

EXAMPLE 4

A fourth electroless copper plating bath, also employing palladium mediator ions, was constructed. In this bath, the ratio of the concentration of the copper ions (complexed with a complexing agent) to the concentration of the palladium ions (complexed with a complexing agent) was 2400:1. The copper deposited onto a substrate immersed in the bath contained 0.22 atomic percent incorporated palladium, distributed substantially uniformly throughout the copper.

The fourth electroless copper plating bath was constructed and operated in exactly the same fashion as the one described in Example 1, with two exceptions. That is, the amount of sodium citrate dihydrate added to the bath was 17.66 grams, resulting in a corresponding 0.060M solution. In addition, the amount of copper sulfate pentahydrate added to the bath was 7.494 grams, resulting in a corresponding 0.030M solution.

While the invention has been particularly shown and described with reference to preferred embodiments thereof, it will be understood by those skilled in the art that various changes in form and details may be made therein without departing from the spirit and scope of the invention.

We claim:

1. An electroless metal plating bath composition, comprising:

water;

a soluble source of metal ions;

a soluble source of mediator ions, different from said metal ions, chosen from the group consisting of palladium ions, platinum ions, silver ions, ruthenium ions, iridium ions, osmium ions and rhodium ions;

a first complexing agent for at least said metal ions; and a reducing agent for reducing said mediator ions.

2. The electroless metal plating bath composition of claim 1, wherein said metal ions include copper ions.

3. The electroless metal plating bath composition of claim 1, wherein said reducing agent for reducing said mediator ions includes hypophosphite ions.

4. An electroless metal plating bath composition, comprising:

water;

a soluble source of metal ions;

a soluble source of mediator ions, different from said metal ions, chosen from the group consisting of palladium ions, platinum ions and silver ions;

a first complexing agent for at least said metal ions; and a reducing agent for reducing said mediator ions.

5. The electroless metal plating bath composition of claim 4, wherein said metal ions include copper ions.

6. The electroless metal plating bath composition of claim 4, wherein said reducing agent for reducing said mediator ions includes hypophosphite ions.

7. An electroless metal plating bath composition, comprising:

water;

a soluble source of metal ions;

a soluble source of palladium mediator ions;

a first complexing agent for at least said metal ions; and a reducing agent for reducing said palladium ions.

8. The electroless metal plating bath composition of claim 7, wherein said metal ions include copper ions.

9. The electroless metal plating bath composition of claim 7, wherein said reducing agent for reducing said palladium ions includes hypophosphite ions.

10. The electroless metal plating bath of claim 1, wherein said composition also includes a second complexing agent for said mediator ions.

11. The electroless metal plating bath of claim 4, wherein said composition also includes a second complexing agent for said mediator ions.

12. The electroless metal plating bath of claim 7, wherein said composition also includes a second complexing agent for said mediator ions.

* * * * *